United States Patent
Kang et al.

(10) Patent No.: US 10,107,866 B2
(45) Date of Patent: Oct. 23, 2018

(54) BATTERY MANAGEMENT SYSTEM FOR OUTPUTTING SIGNAL, CAPABLE ANALYZING WHETHER ERROR HAS OCCURED, AND BATTERY DRIVING SYSTEM INCLUDING SAME

(71) Applicant: LG CHEM, LTD., Seoul (KR)

(72) Inventors: Ju-Hyun Kang, Daejeon (KR); Yasuhito Eguchi, Daejeon (KR); Shoji Tanina, Daejeon (KR)

(73) Assignee: LG CHEM, LTD., Seoul (KR)

( * ) Notice: Subject to any disclaimer, the term of this patent is extended or adjusted under 35 U.S.C. 154(b) by 310 days.

(21) Appl. No.: 15/024,295

(22) PCT Filed: Feb. 17, 2015

(86) PCT No.: PCT/KR2015/001640
§ 371 (c)(1),
(2) Date: Mar. 23, 2016

(87) PCT Pub. No.: WO2015/122746
PCT Pub. Date: Aug. 20, 2015

(65) Prior Publication Data
US 2016/0245874 A1 Aug. 25, 2016

(30) Foreign Application Priority Data

Feb. 17, 2014 (KR) .................. 10-2014-0017848
Feb. 17, 2015 (KR) .................. 10-2015-0023856

(51) Int. Cl.
*H02J 7/00* (2006.01)
*G01R 31/36* (2006.01)
*B60L 11/18* (2006.01)

(52) U.S. Cl.
CPC ...... *G01R 31/3651* (2013.01); *B60L 11/1851* (2013.01); *B60L 11/1861* (2013.01);
(Continued)

(58) Field of Classification Search
USPC ........................................ 320/116
See application file for complete search history.

(56) References Cited

U.S. PATENT DOCUMENTS

2004/0196007 A1  10/2004  Iwashima et al.
2009/0130542 A1  5/2009  Mizoguchi et al.
(Continued)

FOREIGN PATENT DOCUMENTS

KR  10-2006-0022558 A  3/2006
KR  10-2013-0033196 A  4/2013

OTHER PUBLICATIONS

International Search Report issued in PCT/KR2015/001640, dated May 22, 2015.

*Primary Examiner* — Mohammed Alam
(74) *Attorney, Agent, or Firm* — Birch, Stewart, Kolasch & Birch, LLP

(57) ABSTRACT

Disclosed is a battery management system for outputting a signal, capable of determining whether an error has occurred. The battery management system, according to the present invention, includes a plurality of battery management units measuring the voltage of a secondary battery and controlling the charging and discharging thereof. The battery management units output signals when the secondary battery managed thereby is overcharged or overdischarged and errors occur in the units themselves. At this time, the plurality of battery management units output the signals to lines connected in series. In the battery management system, according to the present invention, the waveforms of the signals to be output change according to the amount of current flowing in the lines connected in series.

12 Claims, 8 Drawing Sheets

(52) U.S. Cl.
CPC ..... *G01R 31/3606* (2013.01); *G01R 31/3658* (2013.01); *H02J 7/0021* (2013.01); *H02J 7/0026* (2013.01)

(56) References Cited

U.S. PATENT DOCUMENTS

| | | |
|---|---|---|
| 2011/0121645 A1 | 5/2011 | Zhang et al. |
| 2011/0156714 A1 | 6/2011 | Mizoguchi et al. |
| 2011/0273023 A1 | 11/2011 | Nishida et al. |
| 2012/0306451 A1 | 12/2012 | Arai |
| 2013/0275783 A1* | 10/2013 | Liu .................. G01R 31/3606 713/310 |
| 2014/0285022 A1* | 9/2014 | Dao .................. H02J 9/061 307/66 |
| 2015/0188334 A1* | 7/2015 | Dao .................. H02J 7/0013 320/107 |
| 2016/0245874 A1* | 8/2016 | Kang .............. B60L 11/1851 |

\* cited by examiner

FIG. 2

| 2nd PROT/Diag Rsult | 211-OUTPUT | ADSYNC | 212-OUTPUT | Q(A) |
|---|---|---|---|---|
| ALL L | H | L | H | off |
| | | H | L | on |
| SOME L, SOME H | L | L | L | on |
| | | H | L | on |
| ALL H | L | L | L | on |
| | | H | L | on |

FIG. 3

| 2nd PROT/Diag Rsult | 221-OUTPUT | ADSYNC | 222-OUTPUT | Q(B) |
|---|---|---|---|---|
| ALL H | L | L | H | on |
| | | H | L | off |
| SOME H, SOME L | H | L | H | on |
| | | H | H | on |
| ALL L | H | L | H | on |
| | | H | H | on |

FIG. 5

|  | Q(A) | Q(B) | Q(C) | Q(D) | Q(E) | Q(F) |
|---|---|---|---|---|---|---|
| ADSYNC-low & $0 \leq I_C\_Q1 < I\_thr\_Q(B)$ | On | On | Off | Off | On | Off |
| ADSYNC-low & $I\_thr\_Q(B) \leq I_C\_Q1 < I\_thr\_Q(F)$ | On | On | Off | Off | On | Off |
| ADSYNC-low & $I\_thr\_Q(F) \leq I_C\_Q1$ | Off | On | Off | Off | Off | On |
| ADSYNC-high & $0 \leq I_C\_Q1 < I\_thr\_Q(B)$ | On | Off | On | On | On | Off |
| ADSYNC-high & $I\_thr\_Q(B) \leq I_C\_Q1 < I\_thr\_Q(F)$ | On | On | On | On | On | Off |
| ADSYNC-high & $I\_thr\_Q(F) \leq I_C\_Q1$ | On | On | On | On | Off | On |

BATTERY MANAGEMENT SYSTEM FOR OUTPUTTING SIGNAL, CAPABLE ANALYZING WHETHER ERROR HAS OCCURED, AND BATTERY DRIVING SYSTEM INCLUDING SAME

TECHNICAL FIELD

The present disclosure relates to a battery management system, and more particularly, to a battery management system that outputs a signal capable of analyzing whether an error is in the battery management system itself when transmitting a signal to an external device.

The present application claims priority to Korean Patent Application No. 10-2014-0017848 filed in the Republic of Korea on Feb. 17, 2014, and Korean Patent Application No. 10-2015-0023856 filed in the Republic of Korea on Feb. 17, 2015, the disclosures of which are incorporated herein by reference.

BACKGROUND ART

Due to its characteristics of being easily applicable to various products and electrical characteristics such as a high energy density, a secondary battery is not only commonly applied to a portable device, but universally applied to an electric vehicle (EV), a hybrid electric vehicle (HEV), or an energy storage system that runs on an electrical driving source. This secondary battery is gaining attention for its primary advantage of remarkably reducing the use of fossil fuels and not generating by-products from the use of energy, making it a new eco-friendly and energy efficient source of energy.

A secondary battery can be charged and discharged repeatedly by electrochemical reactions between elements including a positive electrode current collector, a negative electrode current collector, a separator, an active material, an electrolyte solution, and the like. By way of example, a lithium polymer secondary battery being widely used has an operating voltage in the range of about 3.7V to about 4.2V. Accordingly, to obtain a high power battery pack for use in an electric vehicle, a plurality of unit secondary battery cells are connected in series to construct a battery pack.

In addition to this basic structure, the battery pack further includes a battery management system to monitor and control a state of a secondary battery by applying an algorithm for control of power supply to a driving load such as a motor, measurement of electrical characteristic values such as current or voltage, charge/discharge control, voltage equalization control, state of charge (SOC) estimation, and the like.

Recently, with the increasing need for a high-capacity structure as well as utilization as an energy storage source, the demand for a battery pack of a multi-module structure in which a plurality of battery modules including a plurality of secondary battery cells are assembled, is also increasing.

Because the battery pack of the multi-module structure includes a plurality of secondary battery cells, there is a limitation in controlling the charge/discharge state of all the secondary battery cells or the plurality of battery modules using a single battery management system. Accordingly, a recent technology has been introduced in which a battery management unit is mounted in each battery module included in the battery pack, the battery management units are designated as a slave unit, a master unit is additionally provided to control the slave units or at least one of the slave units is designated as a master unit, and the master unit and the slave units make up a battery management system.

In this instance, the battery management units included in the battery management system output, to an external device, a signal indicating whether an error occurred in the secondary battery cells the battery management units manage. However, when a circuit or wiring used to transmit the notification of whether an error occurred is faulty, a signal indicating whether an error occurred is not transmitted despite an error or malfunction occurred in the battery management unit, and in contrast, the battery management unit is in normal state, but nevertheless, a signal indicating that an error occurred in the battery management unit may be transmitted. Accordingly, it is difficult to identify whether an error occurred in the battery management unit itself, or a circuit, a switching device, or a signal line inside the battery management system.

DISCLOSURE

Technical Problem

The present disclosure is designed to address the issue of the related art, and therefore the present disclosure is directed to providing a battery management system that outputs a signal capable of analyzing whether an error is in the battery management system itself when transmitting a signal to an external device.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

To achieve the object, a battery management system according to the present disclosure includes N battery management units configured to diagnose secondary battery cells the battery management units manage and output a signal indicating whether an error occurred, wherein a first battery management unit is configured to output an ADSYNC signal having a low logic level voltage during a data transmission preparation section and having a high logic level voltage during a data transmission section, a first signal detection unit configured to detect when at least one of the signals indicating whether an error occurred, outputted from the N battery management units, indicates a normal state, or when the ADSYNC signal has high logic level voltage, and output low logic level voltage, a second signal detection unit configured to detect when at least one of the signals indicating whether an error occurred, outputted from the N battery management units, indicates an occurrence of an error, or when the ADSYNC signal has low logic level voltage, and output high logic level voltage, a switch A which is turned off by the high logic level voltage outputted from the first signal detection unit, a switch B which is turned on by the high logic level voltage outputted from the second signal detection unit, and a signal output unit electrically connected in series between the switch A and the switch B to output a signal when the switch A and the switch B are turned on concurrently.

According to an embodiment of the present disclosure, the first signal detection unit may include an AND logic gate configured to receive signals indicating whether an error occurred, outputted from the N battery management units, and output a logic value, a NOT logic gate configured to receive the ADSYNC signal outputted from the first battery management unit and output a logic value, and an AND logic gate configured to receive the ADSYNC signals outputted from the AND logic gate and the first battery management unit and output a logic value.

According to an embodiment of the present disclosure, the N battery management units may output low logic level voltage when an error occurred in the secondary battery cells the battery management units manage, and the first signal detection unit may further include a NOT logic gate electrically connected in series between the N battery management units and the AND logic gate.

According to an embodiment of the present disclosure, the second signal detection unit may include an OR logic gate configured to receive the signals indicating whether an error occurred, outputted from the N battery management units, and output a logic value, a NOT logic gate configured to receive the ADSYNC signal outputted from the first battery management unit and output a logic value, and an OR logic gate configured to receive the logic values outputted from the AND logic gate and the NOT logic gate and output a logic value.

According to an embodiment of the present disclosure, the N battery management units may output low logic level voltage when an error occurred in the secondary battery cells the battery management units manage, and may further include a NOT logic gate electrically connected in series between the N battery management units and the OR logic gate.

According to an embodiment of the present disclosure, the battery management system may further include first to $N^{th}$ switches electrically connected to one another and which are turned on by the signals indicating whether an error occurred, outputted from the N battery management units, the first signal detection unit may include a switch F having an electrical connection to turn on when the first to $N^{th}$ switches are all turned on, a switch E having an electrical connection to turn off when the switch F is turned on and turn on when the switch F is turned off, and a switch D having an electrical connection to turn on when the ADSYNC signal has high logic level voltage, to turn on the switch A, and turn off when the ADSYNC signal has low logic level voltage, thereby to determine the turn on or off operation of the switch A based on the turn on or off operation of the switch E, and the second signal detection unit may include a first line configured to electrically connect the switch B to the first switch to turn on when at least one of the first to $N^{th}$ switches is turned on, and a switch C having an electrical connection to turn off when the ADSYNC signal has low logic level voltage, to turn on the switch B.

According to an embodiment of the present disclosure, the first to $N^{th}$ switches may be PNP type bipolar junction transistors.

According to an embodiment of the present disclosure, the switch A may be an NPN type bipolar junction transistor.

According to an embodiment of the present disclosure, the switches B to F may be PNP type bipolar junction transistors.

According to an embodiment of the present disclosure, the signal output unit may be an opto-coupler.

According to an embodiment of the present disclosure, the N battery management units may output index pulses at the start of the data transmission preparation section of the ADSYNC, the start of the data transmission section of the ADSYNC, and the start of multiple data transmitted during the data transmission section of the ADSYNC, and output high logic level voltage under normal condition and output low logic level voltage when an error occurred in the secondary battery cells the battery management units manage.

According to an embodiment of the present disclosure, the index pulses may have low logic level voltage.

The battery management system according to the present disclosure is one component of a battery operating system including the battery management system, and an external device including a determination unit to receive a signal indicating whether an error occurred outputted in the battery management system through the signal output unit of the battery management system, and process the signal.

Advantageous Effects

According to the present disclosure, it is possible to not only determine whether an error occurred in a battery management system through analysis of a signal received by an external device from the battery management system, but also identify a specific location where the error occurred and a type of the error.

The present disclosure may have a variety of other effects, and such effects of the present disclosure will be understood by the following description and become more fully apparent from the exemplary embodiments of the present disclosure.

BRIEF DESCRIPTION OF THE DRAWINGS

The accompanying drawing illustrates a preferred embodiment of the present disclosure and together with the foregoing disclosure, serves to provide further understanding of the technical spirit of the present disclosure, and thus, the present disclosure is not construed as being limited to the drawing.

FIG. 2 is a table summarizing an output signal from a first signal detection unit and the turn ON/OFF operation of switch A in response thereto.

FIG. 3 is a table summarizing an output signal from a second signal detection unit and the turn ON/OFF operation of switch B in response thereto.

FIG. 5 is a table summarizing the turn ON/OFF operation of switches A to F.

MODE FOR INVENTION

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation. Therefore, the description proposed herein is just a preferable example for the purpose of illustrations only, not intended to limit the scope of the disclosure, so it should be understood that other equivalents and modifications could be made thereto without departing from the spirit and scope of the disclosure.

Figure 1:
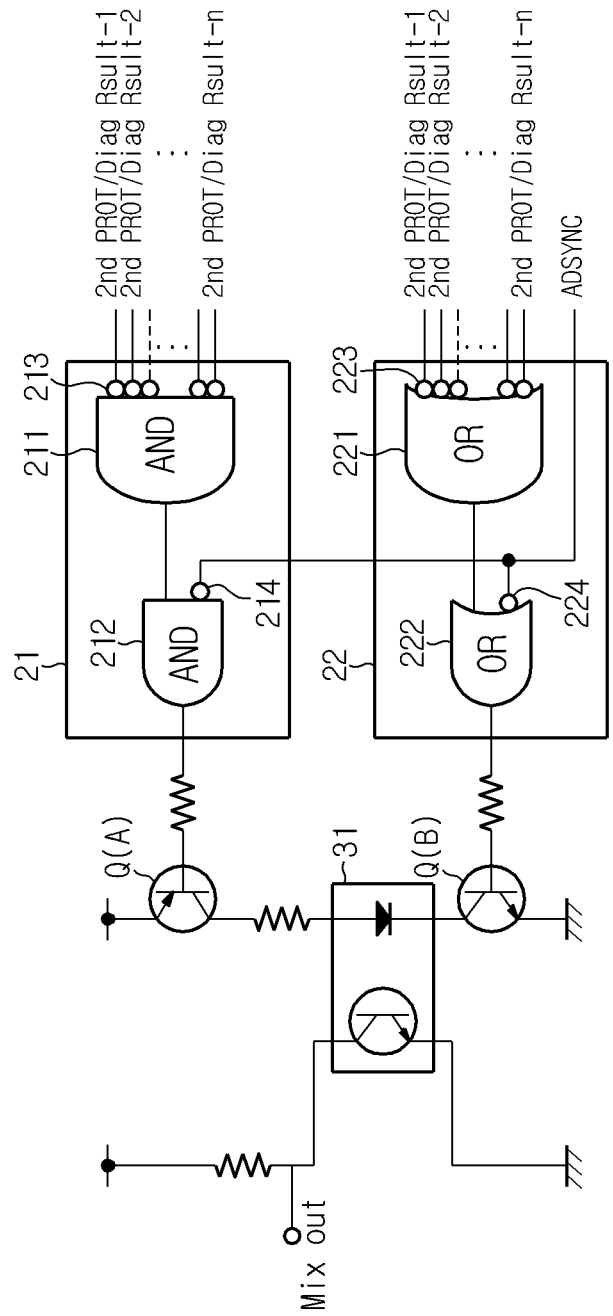
FIG. 1 is a diagram showing an example in which a portion of a battery management system according to the present disclosure is realized using logic gates.
Figure 4:
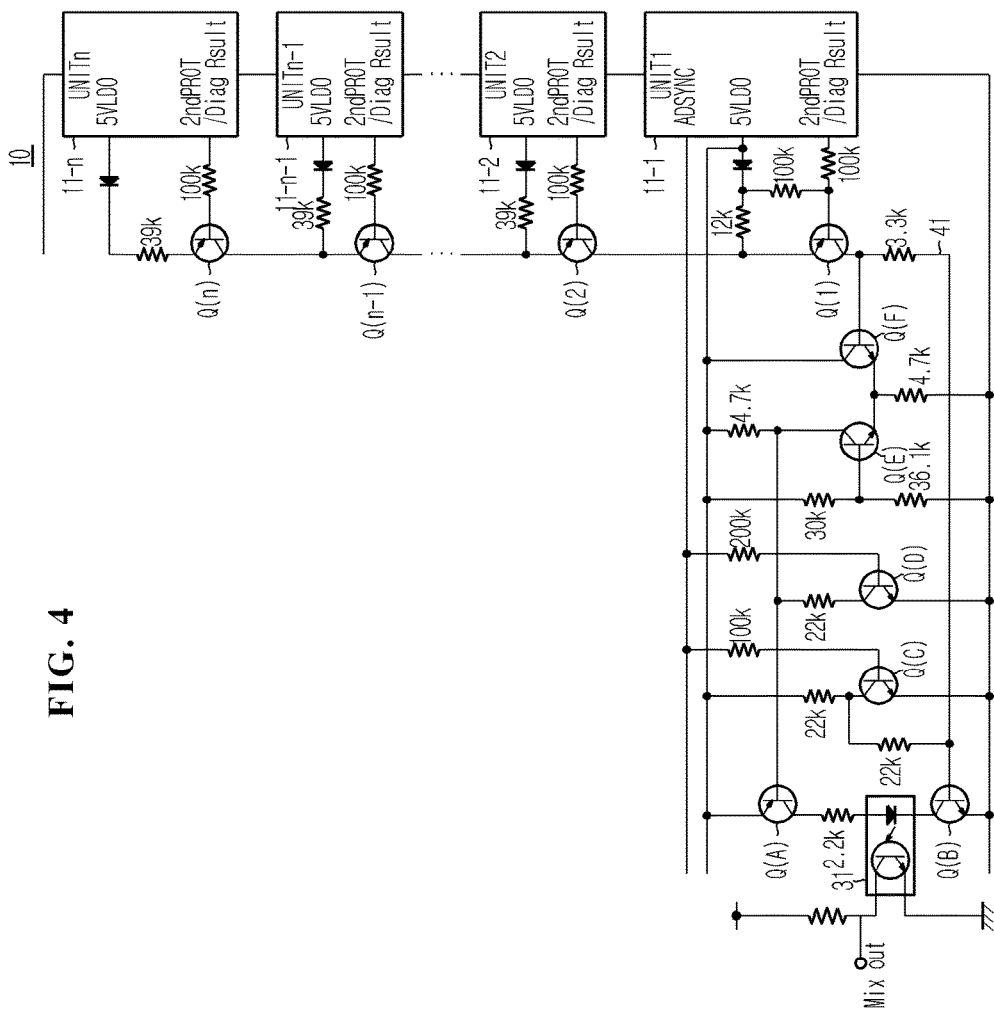
FIG. 4 is a diagram showing an example in which a battery management system according to the present disclosure is constructed using a bipolar junction transistor.

FIG. 1 is a diagram showing an example in which a portion of a battery management system according to the present disclosure is realized using logic gates, FIG. 2 is a table summarizing an output signal from a first signal detection unit and the turn ON/OFF operation of switch A in response thereto, FIG. 3 is a table summarizing an output signal from a second signal detection unit and the turn ON/OFF operation of switch B in response thereto, and FIG. 4 is a diagram showing an example in which the battery management system according to the present disclosure is constructed using a bipolar junction transistor.

Referring to FIGS. 1 and 4 together, each component of the battery management system 10 according to the present disclosure will be described.

The battery management system 10 according to the present disclosure includes N battery management units 11-1~11-n, a first signal detection unit 21, a second signal detection unit 22, switch A (Q(A)), switch B (Q(B)), and a signal output unit 31. Here, N is a natural number of 1 or more, and at least one battery management unit may be provided. The N battery management units 11-1~11-n, the first signal detection unit 21, the second signal detection unit 22, the switch A (Q(A)), the switch B (Q(B)), and the signal output unit 31 are electrically connected to one another to implement an operation as described below in detail.

Figure 6:
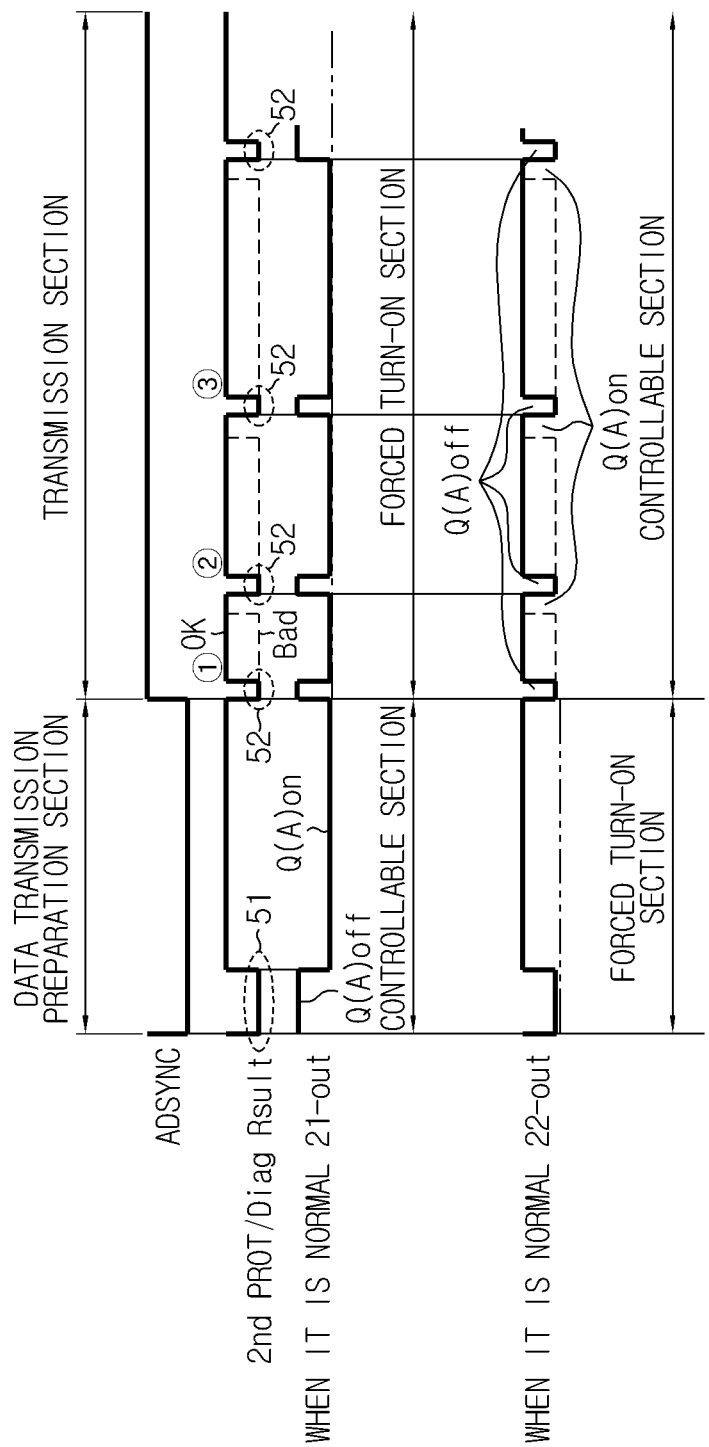
FIG. 6 shows waveforms of signals outputted from each part of a battery management system according to the present disclosure.

Among the N battery management units, the first battery management unit 11-1 may output an ADSYNC signal (see ADSYNC terminal in FIG. 4). Referring to FIG. 6, ADSYNC is found at the top of the illustrated signal waveform. One cycle of the ADSYNC signal consists of two sections: a 'data transmission preparation section' and a 'data transmission section'. The first battery management unit 11-1 outputs a signal having a low logic level voltage during the data transmission preparation section, and a signal having a high logic level voltage during the data transmission section. For example, the low logic level voltage may be 0V, and the high logic level voltage may be 5V. However, the low logic level voltage value and the high logic level voltage value are provided by way of illustration only, and may be set to various values.

The N battery management units 11-1~11-n diagnose secondary battery cells the battery management units manage or make a diagnosis of a fault in the battery management units themselves, and output a signal indicating whether an error occurred (2ndPROT/Diag Rsult). The term 'whether an error occurred' represents a signal including at least one piece of information associated with overcharge and overdischarge of the secondary battery cells the battery management units manage and whether a fault occurred in the battery management units themselves. When the signal indicating 'whether an error occurred' is a signal including at least two pieces of information, the at least two pieces of information may be represented by a time division method based on a preset time and/or sequence, and each battery management unit may output a signal indicating whether an error occurred based on a preset time and/or sequence.

According to an embodiment, the N battery management units 11-1~11-n may be configured to output low logic level voltage when an error occurred in the secondary battery cells the battery management units manage or the battery management units themselves, and high logic level voltage in normal state, i.e., when an error did not occur.

The first signal detection unit 21 detects when at least one of the signals indicating whether an error occurred, outputted from the N battery management units 11-1~11-n, indicates a normal state, or when the ADSYNC signal has high logic level voltage, and outputs low logic level voltage.

The second signal detection unit 22 detects when at least one of the signals indicating whether an error occurred, outputted from the N battery management units 11-1~11-n, indicates an occurrence of an error, or when the ADSYNC signal has low logic level voltage, and outputs high logic level voltage.

The switch A (Q(A)) is turned on by the low logic level voltage outputted from the first signal detection unit 21, and is turned off by the high logic level voltage.

The switch B (Q(B)) is turned on by the high logic level voltage outputted from the second signal detection unit 22, and is turned off by the low logic level voltage.

The signal output unit 31 is electrically connected in series between the switch A (Q(A)) and the switch B (Q(B)), to output a signal when the switch A (Q(A)) and the switch B (Q(B)) are turned on concurrently.

Hereinafter, the battery management system 10 according to the present disclosure will be described in more detail with reference to the specific embodiments.

Returning to FIG. 1, it can be seen that the switch A (Q(A)) which is turned on by the low level voltage outputted from the first signal detection unit 21, and is turned off by the high logic level voltage is implemented as a PNP type bipolar junction transistor (PNP-BJT). That is, the switch A (Q(A)) is implemented as a PNP type bipolar junction transistor and configured to receive an input of a voltage level outputted from the first signal detection unit 21 through a base terminal. Because the switch A (Q(A)) is a PNP type bipolar junction transistor, the switch A (Q(A)) is turned on when low logic level voltage is inputted through the base terminal, and is turned off when high logic level voltage is inputted through the base terminal. Also, it can be seen that the switch B (Q(B)) which is turned on by the high logic level voltage outputted from the second signal detection unit 22, and is turned off by the low logic level voltage is implemented as an NPN type bipolar junction transistor (NPN-BJT). That is, the switch B (Q(B)) is implemented as an NPN type bipolar junction transistor and configured to receive an input of a voltage level outputted from the second signal detection unit 22 through the base terminal. Because the switch B (Q(B)) is an NPN type bipolar junction transistor, the switch B (Q(B)) is turned on when high logic level voltage is inputted through the base terminal, and is turned off when low logic level voltage is inputted through the base terminal. In this instance, the PNP type bipolar junction transistor and the PNP type bipolar junction transistor are known technology, and in the light of the technical general knowledge of a person having an ordinary skill in the art, its description shall be an obvious matter just the same as the disclosure made herein, and a detailed description of each terminal and its operation will be omitted herein.

Also, it can be seen that the signal output unit 31 is implemented as an opto-coupler. The opto-coupler is a switching device consisting of a light source and a light detector. An infrared light-emitting diode (LED) may be used as the light source of the opto-coupler, and a photodiode or a phototransistor may be used as the light detector. Here, the photodiode or phototransistor is designed to turn on when receiving light from the light source. Thus, when an electric current flows to the light source, the light source emits light and the light detector receives light emitted from the light source and is turned on. Because the opto-coupler transmits a signal using light, the opto-coupler may electrically isolate a transmitter from a receiver while transmitting a signal.

In this instance, the opto-coupler is electrically connected in series between the switch A (Q(A)) and the switch B (Q(B)) and is configured to output a signal when the switch A (Q(A)) and the switch B (Q(B)) are turned on concurrently.

According to an embodiment of the present disclosure, the first signal detection unit 21 includes two AND logic gates 211 and 212 and a NOT logic gate 214. The AND logic gate, the NOT logic gate, and an OR logic gate as described below are known components and in the light of the technical general knowledge of a person having an ordinary skill in the art, their description shall be an obvious matter just the same as the disclosure made herein, and a description of input/output operations will be omitted herein.

The AND logic gate 211 receives signals (2ndPROT/Diag Rsult-1, 2ndPROT/Diag Rsult-2, . . . , 2ndPROT/Diag Rsult-n) indicating whether an error occurred, outputted from the N battery management units 11-1~11-n, and outputs a logic value.

As described above, according to an embodiment of the present disclosure, the N battery management units 11-1~11-n output low logic level voltage when an error occurred in the secondary battery cells the battery management units manage or the battery management units themselves. In this case, the first signal detection unit 21 may further include a NOT logic gate 213 electrically connected in series between the N battery management units 11-1~11-n and the AND logic gate 211.

The AND logic gate 212 receives the ADSYNC signals outputted from the AND logic gate 211 and the first battery management unit 11-1, and outputs a logic value. In this instance, the ADSYNC signal outputted from the first battery management unit 11-1 is outputted through the NOT logic gate 214. Thus, the AND logic gate 212 receives the values outputted from the AND logic gate 211 and the NOT logic gate 214 and outputs a logic value.

Thus, the first signal detection unit 21 may detect when at least one of the signals indicating whether an error occurred, outputted from the N battery management units 11-1~11-n, indicates a normal state, or when the ADSYNC signal has high logic level voltage, and output low logic level voltage. As a consequence, the switch A (Q(A)) is turned on by the low logic level voltage outputted from the first signal detection unit 21, and is turned off by the high log level voltage.

The output signal of the first signal detection unit 21 and the turn ON/OFF operation of the switch A (Q(A)) in response thereto is summarized in FIG. 2.

According to an embodiment of the present disclosure, the second signal detection unit 22 includes two OR logic gates 221 and 222 and a NOT logic gate 224.

One of the two OR logic gates, the OR logic gate 221, receives signals (2ndPROT/Diag Rsult-1, 2ndPROT/Diag Rsult-2, . . . , 2ndPROT/Diag Rsult-n) indicating whether an error occurred, outputted from the N battery management units 11-1~11-n, and outputs a logic value.

As described above, according to an embodiment of the present disclosure, the N battery management units 11-1~11-n may output low logic level voltage when an error occurred in the secondary battery cells the battery management units manage. In this case, the second signal detection unit 22 may further include a NOT logic gate 223 electrically connected in series between the N battery management units 11-1~11-n and the OR logic gate 221.

Of the two OR logic gates, the other OR logic gate 222 receives the ADSYNC signals outputted from the OR logic gate 221 and the first signal detection unit 11-1, and outputs a logic value. In this instance, the ADSYNC signal outputted from the first signal detection unit 11-1 is outputted through the NOT logic gate 224. Thus, the OR logic gate 222 receives the values outputted from the OR logic gate 221 and the NOT logic gate 224, and outputs a logic value.

Thus, the second signal detection unit 22 detects when at least one of the signals whether an error occurred, outputted from the N battery management units 11-1~11-n, indicates an occurrence of an error or when the ADSYNC signal has low logic level voltage, and outputs high logic level voltage. As a consequence, the switch B (Q(B)) is turned on by the high logic level voltage outputted from the second signal detection unit 22, and is turned off by the low logic level voltage.

The output signal of the second signal detection unit 22 and the turn ON/OFF operation of the switch B (Q(B)) is summarized in FIG. 3.

FIG. 4 is a diagram showing an example in which the battery management system 10 is constructed using a bipolar junction transistor.

Referring to FIG. 4, it can be seen that the first signal detection unit 21 and the second signal detection unit 22 are implemented through switch B (Q(B)), switch C (Q(C)), switch D (Q(D)), switch E (Q(E)), switch F (Q(F)), first to $n^{th}$ switches (Q(1)~Q(n)), and a resistor device.

First, the N battery management units 11-1~11-n are respectively connected to the first to $n^{th}$ switches (Q(1)~Q(n)). The first to $n^{th}$ switches (Q(1)~Q(n)) may be implemented as a PNP type bipolar junction transistor as shown in FIG. 4. A fixed voltage (5VLDO) outputted from each battery management unit 11 is applied to an emitter terminal of each PNP type bipolar junction transistor. The voltage outputted from each battery management unit 11 has a value of, for example, 5V, and may have other values. Also, a signal (2ndPROT/Diag Rsult) indicating whether an error occurred, outputted from each battery management unit 11, is applied to a base terminal of each PNP type bipolar junction transistor. Thus, when each battery management unit 11 outputs low logic level voltage to indicate whether an error occurred, each PNP type bipolar junction transistor is turned on.

The first to $N^{th}$ switches (Q(1)~Q(n)) are designed to be electrically connected in series. That is, the first to $N^{th}$ switches implemented as a PNP type bipolar junction transistor are designed to connect a collector and an emitter of an adjacent PNP type bipolar junction transistor. Thus, when the first to $N^{th}$ switches (Q(1)~Q(n)) are all turned on, when some of the first to $N^{th}$ switches (Q(1)~Q(n)) are turned on, and when the first to $N^{th}$ switches (Q(1)~Q(n)) are all turned off, an amount of current flowing in a collector terminal of the first switch (Q(1)) differs.

The first signal detection unit 21 includes switch D (Q(D)), switch E (Q(E)), and switch F (Q(F)). The switch D (Q(D)), the switch E (Q(E)), and the switch F (Q(F)) may be implemented as a PNP type bipolar junction transistor.

The switch F (Q(F)) has such an electrical connection that it is turned on when the first to $N^{th}$ switches (Q(1)~Q(n)) are all turned on. The switch F (Q(F)) may be implemented as a selected transistor having a feature that it is turned on by the amount of current flowing in the collector terminal of the first switch ((Q(1)) when the first to $N^{th}$ switches (Q(1)~Q(n)) are all turned on. Also, according to the feature of the switch F (Q(F)), a resistance value of the resistor device connected to the first to $N^{th}$ switches (Q(1)~Q(n)) may be selected. In addition, it is obvious to those skilled in the art to implement the switch F (Q(F)) by suitably adjusting the transistor and the device value of the resistor device.

The switch E (Q(E)) has such an electrical connection that it is turned off when the switch F (Q(F)) is turned on, and it is turned on when the switch F (Q(F)) is turned off.

Also, the switch D (Q(D)) is turned on when the ADSYNC signal has high logic level voltage, to turn on the switch A (Q(A)). Also, the switch D (Q(D)) is turned off when the ADSYNC signal has low logic level voltage. In this case (in the case where the switch D is turned off), the switch A (Q(A)) has such an electrical connection that it is turned on by the turn-on of the switch E (Q(E)) or turned off by the turn-off of the switch E (Q(E)).

Thus, the first signal detection unit 21 detects when at least one of the signals indicating whether an error occurred, outputted from the N battery management units 11-1~11-n, indicates a normal state or when the ADSYNC signal has high logic level voltage, and outputs low logic level voltage. As a consequence, the switch A (Q(A)) is turned on by the low logic level voltage outputted from the first signal detection unit 21.

The second signal detection unit 22 includes switch B (Q(B)), a first line 41 electrically connecting the switch B (Q(B)) to the first switch (Q(1)), and switch C (Q(C)). The switch C (Q(C)) may be a PNP type bipolar junction transistor.

The first line 41 is connected between the switch B (Q(B)) and the first switch (Q(1)), and the switch B (Q(B)) is configured to be turned on when at least one of the first to $n^{th}$ switches (Q(1)~Q(n)) is turned on. More specifically, the first line 41 is designed to be connected between the collector of the first switch (Q(1)) and the base of the switch B (Q(B)). The switch B (Q(B)) may be implemented as a selected transistor having a feature that it is turned on by an electric current flowing in the collector terminal of the first switch (Q(1)) when at least one of the first to $n^{th}$ switches (Q(1)~Q(n)) is turned on. Also, according to the feature of the switch B (Q(B)), a resistance value of the resistor device connected to the first to $n^{th}$ switches (Q(1)~Q(n)) or a resistance value of the resistor device connected between the collector of the first switch (Q(1)) and the switch B (Q(B)) may be selected. In addition, those skilled in the art may implement the foregoing operation to be performed by suitably adjusting the transistor and the device value of the resistor device.

Also, the switch C (Q(C)) has such an electrical connection that it is turned off when the ADSYNC signal has low logic level voltage, to turn on the switch B (Q(B)).

The resistance value of each resistor device shown in FIG. 4 is an exemplary value selected to implement the foregoing operation. Thus, it is possible to adjust the resistance value in consideration of real operating characteristics of the switches A to F (Q(A)~Q(F)).

FIG. 5 is a table summarizing the turn ON/OFF operation of the switches A to F (Q(A)~Q(F)).

Referring to FIG. 5, in response to the voltage level of the ADSYNC signal and the signals indicating whether an error occurred outputted from the N battery management units 11-1~11-n, the turn ON/OFF operation of the switches A to F (Q(A)~Q(F)) is described in the form of a table.

To help the understanding of the table of FIG. 5, the terms as used herein will be described.

The voltage level of the ADSYNC signal has high logic level voltage and low logic level voltage. Thus, when the ADSYNC has a high logic level, 'ADSYNC-high' is indicated. Also, when the ADSYNC has a low logic level, 'ADSYNC-low' is indicated.

The signals indicating whether an error occurred, outputted from the N battery management units 11-1~11-n, may be classified based on a value of electric current flowing in the collector terminal of the first switch (Q(1)). The value of electric current flowing in the collector terminal of the first switch (Q(1)) is indicated by 'Ic_Q1'. The value of electric current (Ic_Q1) flowing in the collector terminal of the first switch may have a total of three sections. First, the value of electric current (Ic_Q1) flowing in the collector terminal of the first switch (Q(1)) has a value smaller than a threshold current value (I_thrQ(B)) at which the switch B (Q(B)) is turned on. In this case, all the N battery management units 11-1~11-n maintained the turn-off state of all the first to $N^{th}$ switches (Q(1)~Q(n)). Subsequently, the value of electric current (Ic_Q1) flowing in the collector terminal of the first switch (Q(1)) has a value larger than or equal to a threshold current value (I_thr_Q(B)) at which the switch B is turned on, but has a value smaller than a threshold current value (I_thrQ(F)) at which the switch F (Q(F)) is turned on. In this case, the N battery management units 11-1~11-n turned on only some of the first to $N^{th}$ switches (Q(1)~Q(n)). Lastly, the value of electric current (Ic_Q1) flowing in the collector terminal of the first switch (Q(1)) has a value larger than or equal to a threshold current value (I_thrQ(F)) at which the switch F (Q(F)) is turned on. In this case, all the N battery management units 11-1~11-n turned on all the first to $N^{th}$ switches (Q(1)~Q(n)).

The battery management system 10 according to the present disclosure is characterized in that it outputs a signal to allow an external device receiving a signal from the battery management system 10 to analyze whether an error occurred. To do so, the battery management system 10 according to the present disclosure controls the switch A (Q(A)) and the switch B (Q(B)) to analyze whether an error occurred through a signal outputted from the signal output unit 31. The following is a description of a method of analyzing whether an error occurred in the battery management system itself through a signal outputted when an error did not occur in the battery management system 10 according to the present disclosure and a signal outputted when an error occurred.

The battery management system 10 according to the present disclosure may be one component of a battery operating system including the battery management system 10 and the external device. The battery operating system may include, for example, an electric vehicle (EV), a hybrid electric vehicle (HEV), an electric bike (E-Bike), a power tool, an energy storage system, an uninterruptible power supply (UPS), a portable computer, a mobile phone, a portable audio device, and a portable video device. In this instance, the external device may be a central controller of a device which is supplied with power from the battery pack the battery management system 10 according to the present disclosure manages.

The external device includes a determination unit (not shown), and the determination unit may receive and process a signal indicating whether an error occurred in the battery management system through the signal output unit of the battery management system.

For the convenience of understanding, the battery management system 10 is a system for managing a battery pack mounted in an electric car, and the external device is a main controller of the electric car. Thus, the battery management system 10 provides the main controller of the electric car with notification of whether an error occurred in the battery pack mounted in the electric car. In this instance, assume the main controller includes logic that diagnoses whether an error occurred in the battery pack and the battery management system 10 itself through analysis of the signal outputted from the battery management system 10.

FIG. 6 shows waveforms of signals outputted from each part of the battery management system 10 according to the present disclosure.

Referring to FIG. 6, above all, a waveform of ADSYNC is seen.

The ADSYNC has, as described above, low logic level voltage during a data transmission preparation section and high logic level voltage during a data transmission section.

The second as seen is a waveform of a signal (2ndPROT/Diag Rsult) indicating whether an error occurred, outputted from each battery management unit 11. According to an embodiment of the present disclosure, the battery management unit 11 may output index pulses 51 and 52 at the start of a data transmission preparation section of the ADSYNC, the start of a data transmission section of the ADSYNC, and the start of multiple data transmitted during the data transmission section of the ADSYNC. Also, the battery management unit 11 may transmit information intended to transmit (e.g., overcharge and over-discharge of the secondary battery cells, and whether an error occurred in the secondary battery cells) using overlapped transmission during the data transmission section of the ADSYNC. In this instance, the battery management unit 11 outputs high logic level voltage under normal condition, and outputs low logic level voltage when an error occurred in the secondary battery cells the battery management unit manages.

The waveform shown in FIG. 6 is an exemplary waveform according to an embodiment in which a total of three pieces of information is transmitted by a time division method. The three pieces of information may include information associated with overcharge (①), over-discharge (②), and self-diagnosis results (③) of the secondary battery cells each battery management unit 11 manages, and may be information resulting from time-division of information associated with whether an error occurred, transmitted from each battery management unit. Also, in the illustration of FIG. 6, high logic level voltage is outputted for all the three pieces of information, indicating that an error did not occur in the secondary battery cells and the battery management unit itself.

The third as seen is a signal (21-out) outputted from the first signal detection unit 21. As described above, the first signal detection unit 21 detects when at least one of the signals indicating whether an error occurred, outputted from the N battery management units 11-1~11-n, outputs a high logic level (i.e., when at least one indicates a normal state), or when the ADSYNC signal has high logic level voltage, and outputs low logic level voltage. Thus, the 21-out signal has, in principle, a waveform of the opposite logic level to the second waveform. However, during the data transmission section where the ADSYNC has high logic level voltage, the first signal detection unit outputs low logic level voltage irrespective of the signal indicating whether an error occurred (see the forced turn-on section of FIG. 6).

The fourth as seen is a signal (22-out) outputted from the second signal detection unit 22. As described above, the second signal detection unit 22 detects when at least one of the signals indicating whether an error occurred, outputted from the N battery management units 11-1~11-n, outputs low logic level voltage (i.e., when at least one indicates an occurrence of an error), or when the ADSYNC signal has low logic level voltage, and outputs high logic level voltage. Thus, the 22-out signal has, in principle, a waveform of the same logic level as the second waveform. However, during the data transmission preparation section where the ADSYNC has low logic level voltage, the second signal detection unit outputs high logic level voltage irrespective of the signal indicating whether an error occurred (see the forced turn-on section of 6).

As described above, only when the switch A (Q(A)) are turned on by the signal outputted from the first signal detection unit 21 and the switch B (Q(B)) are turned on by the signal outputted from the second signal detection unit 22 concurrently, the signal output unit 31 outputs the signal to the external device. In contrast, when any one of the switch A (Q(A)) and the switch B (Q(B)) is turned off, the signal output unit 31 does not output the signal to the external device.

Figure 7:
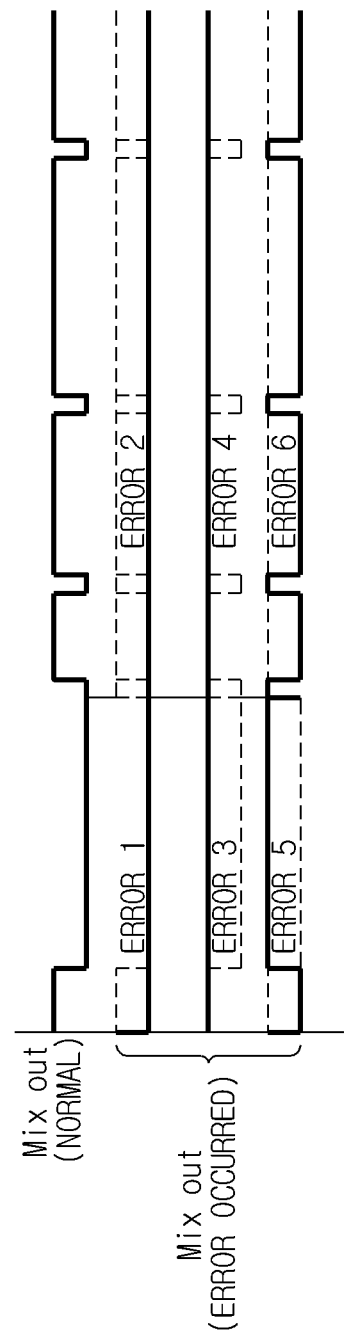
FIG. 7 shows a waveform of a signal received by an external device through a signal output unit.

FIG. 7 shows a waveform of the signal received by the external device through the signal output unit 31.

Referring to FIG. 7, the uppermost waveform indicates that an error did not occur in the battery management system 10, i.e., a normal state. When a signal such as the illustrated waveform is received, the determination unit included in the external device determines that the battery management system 10 is in normal state.

The second to fourth waveforms indicate that an error occurred in the battery management system 10.

Figure 8:
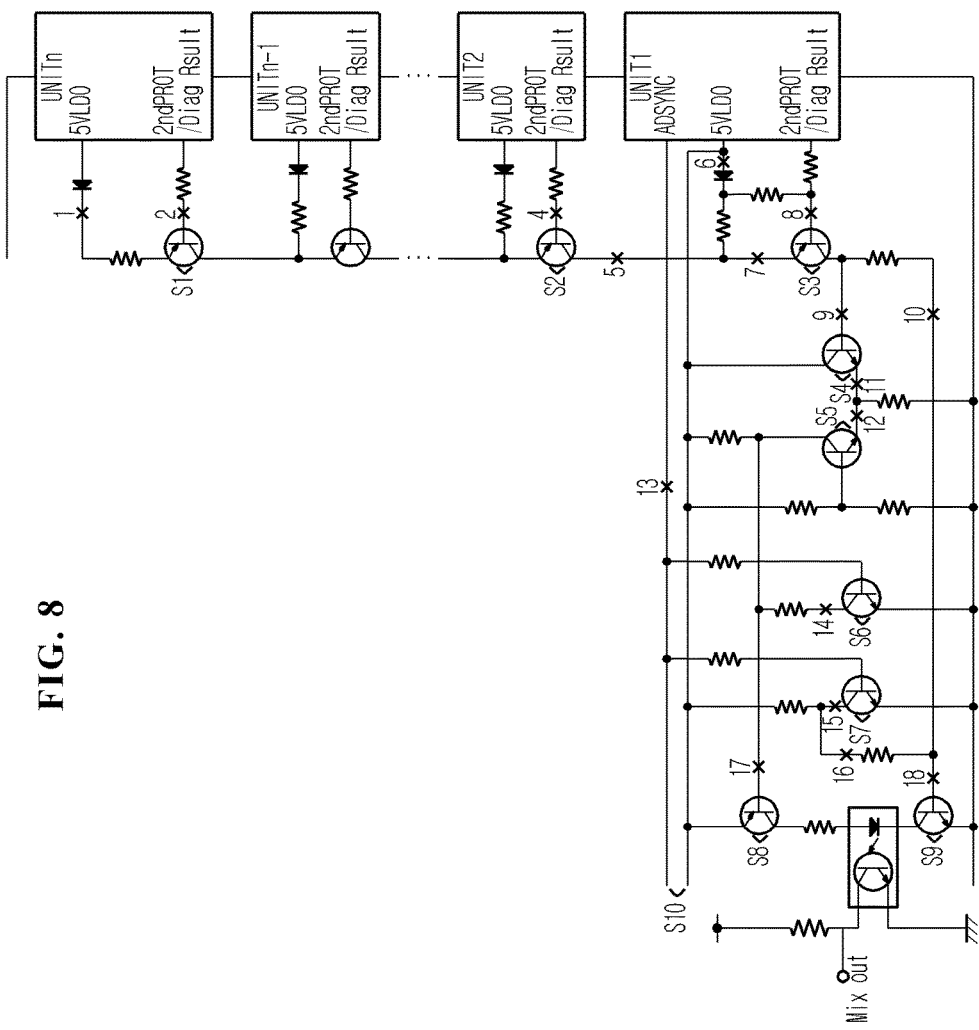
FIG. 8 is a circuit diagram showing a location where an error occurred in the battery management system shown in FIG. 4.

FIG. 8 is a circuit diagram showing a location where an error occurred in the battery management system 10 shown in FIG. 4.

Referring to FIG. 8, parts 1, 2, 4-18 marked with 'X' represent disconnection, and parts S1, S2, S3, S4, S5, S6, S7, S8, and S9 marked with '<' represent short.

Referring to FIGS. 7 and 8 together, when disconnection 1 through 6 occurred, when disconnection 9 occurred, when disconnection 11 occurred, when short S5 occurred, when short S6 occurred, or when short S8 occurred, an index pulse of the data transmission preparation section of the ADSYNC does not appear (error 1).

When short S1 through S3, and S9 occurred, only a low logic level voltage waveform is received during the data transmission section of the ADSYNC (error 2).

When disconnection 12, disconnection 16, short S4, and short S7 occurred, only a high logic level voltage waveform is received during the data transmission preparation section of the ADSYNC (error 3).

When disconnection 10, disconnection 14, and disconnection 15 occurred, only a high logic level voltage waveform is received during the data transmission section of the ADSYNC (error 4).

When short S10 occurred, a waveform having the opposite logic level to a normal state is received during the data transmission preparation section of the ADSYNC (error 5).

When disconnection 13 occurred, a waveform having the opposite logic level to a normal state is received during the data transmission section of the ADSYNC (error 5).

When disconnection 7 or 8 occurred, the error 1 and 4 phenomena appear together.

When disconnection 17 or 18 occurred, the error 3 and 4 phenomena appear together.

As described above, the determination unit included in the external device may analyze the received waveform, and determine whether an error occurred in the battery management system 10 as well as a specific location where the error occurred and a type of the error.

Meanwhile, in the description of the present disclosure, it should be understood that each element or component of the present disclosure shown in FIGS. 1 and 2 is distinguished logically rather than physically.

That is, each element or component corresponds to a logic element or component to realize the technical features of the present disclosure, and accordingly, it should be understood that even though each element or component is integrated or separated, it falls within the scope of the present disclosure if a function performed by a logic element or component of the present disclosure can be implemented, and it falls within the scope of the present disclosure regardless of whether names are identical or not if it is an element or component performing an identical or similar function.

While the present disclosure has been hereinabove described in connection with a limited number of embodiments and drawings, the present disclosure is not limited thereto, and it should be understood that various modifications and changes may be made by those skilled in the art within the technical spirit of the invention and equivalents to the appended claims.

What is claimed is:

1. A battery management system comprising:
   N battery management units configured to diagnose secondary battery cells the battery management units manage, or make a diagnosis of a fault in the battery management units, and output a signal indicating whether an error occurred, wherein a first battery management unit is configured to output an ADSYNC signal having a low logic level voltage during a data transmission preparation section and having a high logic level voltage during a data transmission section, wherein the secondary battery is defined as a battery that can be charged and discharged repeatedly by electrochemical reactions between elements including a positive electrode current collector, a negative electrode current collector, a separator, an active material, an electrolyte solution;
   a first signal detection unit configured to detect when at least one of the signals indicating whether an error occurred, outputted from the N battery management units, indicates a normal state, or when the ADSYNC signal has high logic level voltage, and output low logic level voltage;
   a second signal detection unit configured to detect when at least one of the signals indicating whether an error occurred, outputted from the N battery management units, indicates an occurrence of an error, or when the ADSYNC signal has low logic level voltage, and output high logic level voltage;
   a switch A which is turned on by the low logic level voltage outputted from the first signal detection unit;
   a switch B which is turned on by the high logic level voltage outputted from the second signal detection unit; and
   a signal output unit electrically connected in series between the switch A and the switch B to output a signal when the switch A and the switch B are turned on concurrently,
   wherein the first signal detection unit comprises:
   a first AND logic gate configured to receive signals indicating whether an error occurred, outputted from the N battery management units, and output a logic value;
   a first NOT logic gate configured to receive the ADSYNC signal outputted from the first battery management unit and output a logic value; and
   a second AND logic gate configured to receive the signals outputted from the first AND logic gate and the first NOT logic gate and output a logic value.

2. The battery management system according to claim 1, wherein the N battery management units output low logic level voltage when an error occurred in the secondary battery cells the battery management units manage or the battery management units, and the first signal detection unit further comprises a second NOT logic gate electrically connected in series between the N battery management units and the first AND logic gate.

3. A battery management system comprising:
   N battery management units configured to diagnose secondary battery cells the battery management units manage, or make a diagnosis of a fault in the battery management units, and output a signal indicating whether an error occurred, wherein a first battery management unit is configured to output an ADSYNC signal having a low logic level voltage during a data transmission preparation section and having a high logic level voltage during a data transmission section, wherein the secondary battery is defined as a battery that can be charged and discharged repeatedly by electrochemical reactions between elements including a positive electrode current collector, a negative electrode current collector, a separator, an active material, an electrolyte solution;
   a first signal detection unit configured to detect when at least one of the signals indicating whether an error occurred, outputted from the N battery management units, indicates a normal state, or when the ADSYNC signal has high logic level voltage, and output low logic level voltage;
   a second signal detection unit configured to detect when at least one of the signals indicating whether an error occurred, outputted from the N battery management units, indicates an occurrence of an error, or when the ADSYNC signal has low logic level voltage, and output high logic level voltage;
   a switch A which is turned on by the low logic level voltage outputted from the first signal detection unit;
   a switch B which is turned on by the high logic level voltage outputted from the second signal detection unit; and
   a signal output unit electrically connected in series between the switch A and the switch B to output a signal when the switch A and the switch B are turned on concurrently,
   a first OR logic gate configured to receive the signals indicating whether an error occurred, outputted from the N battery management units, and output a logic value;
   a third NOT logic gate configured to receive the ADSYNC signal outputted from the first battery management unit and output a logic value; and
   a second OR logic gate configured to receive the logic values outputted from the first OR logic gate and the third NOT logic gate and output a logic value.

4. The battery management system according to claim 3, wherein the N battery management units output low logic level voltage when an error occurred in the secondary battery cells the battery management units manage, and further comprise a fourth NOT logic gate electrically connected in series between the N battery management units and the first OR logic gate.

5. A battery management system comprising:
N battery management units configured to diagnose secondary battery cells the battery management units manage, or make a diagnosis of a fault in the battery management units, and output a signal indicating whether an error occurred, wherein a first battery management unit is configured to output an ADSYNC signal having a low logic level voltage during a data transmission preparation section and having a high logic level voltage during a data transmission section, wherein the secondary battery is defined as a battery that can be charged and discharged repeatedly by electrochemical reactions between elements including a positive electrode current collector, a negative electrode current collector, a separator, an active material, an electrolyte solution;
a first signal detection unit configured to detect when at least one of the signals indicating whether an error occurred, outputted from the N battery management units, indicates a normal state, or when the ADSYNC signal has high logic level voltage, and output low logic level voltage;
a second signal detection unit configured to detect when at least one of the signals indicating whether an error occurred, outputted from the N battery management units, indicates an occurrence of an error, or when the ADSYNC signal has low logic level voltage, and output high logic level voltage;
a switch A which is turned on by the low logic level voltage outputted from the first signal detection unit;
a switch B which is turned on by the high logic level voltage outputted from the second signal detection unit;
a signal output unit electrically connected in series between the switch A and the switch B to output a signal when the switch A and the switch B are turned on concurrently; and
first to $N^{th}$ switches electrically connected to one another and which are turned on by the signals indicating whether an error occurred, outputted from the N battery management units,
wherein the first signal detection unit comprises:
a switch F having an electrical connection to turn on when the first to $N^{th}$ switches are all turned on;
a switch E having an electrical connection to turn off when the switch F is turned on and turn on when the switch F is turned off; and
a switch D having an electrical connection to turn on when the ADSYNC signal has high logic level voltage, to turn on the switch A, and turn off when the ADSYNC signal has low logic level voltage, thereby to determine the turn on or off operation of the switch A based on the turn on or off operation of the switch E, and
the second signal detection unit comprises:
a first line configured to electrically connect the switch B to the first switch to turn on when at least one of the first to $N^{th}$ switches is turned on; and
a switch C having an electrical connection to turn off when the ADSYNC signal has low logic level voltage, to turn on the switch B.

6. The battery management system according to claim 5, wherein the first to $N^{th}$ switches are PNP type bipolar junction transistors.

7. The battery management system according to claim 5, wherein the switch A is an NPN type bipolar junction transistor.

8. The battery management system according to claim 5, wherein the switches B to F are PNP type bipolar junction transistors.

9. The battery management system according to claim 1, wherein the signal output unit is an opto-coupler.

10. The battery management system according to claim 1, wherein the N battery management units output index pulses at the start of the data transmission preparation section of the ADSYNC, the start of the data transmission section of the ADSYNC, and the start of multiple data transmitted during the data transmission section of the ADSYNC, and output high logic level voltage under normal condition and output low logic level voltage when an error occurred in the secondary battery cells the battery management units manage.

11. The battery management system according to claim 10, wherein the index pulses have low logic level voltage.

12. A battery operating system comprising:
a battery management system according to claim 1; and
an external device comprising a determination unit to receive a signal indicating whether an error occurred outputted in the battery management system through the signal output unit of the battery management system, and process the signal.

* * * * *